United States Patent [19]
Gardner et al.

[11] Patent Number: 5,898,317
[45] Date of Patent: Apr. 27, 1999

[54] CONFIGURABLE MONOLITHIC SEMICONDUCTOR CIRCUIT AND METHOD FOR CONFIGURING

[75] Inventors: Robert M. Gardner; Jerald A. Hallmark, both of Gilbert; Daniel S. Marshall, Chandler, all of Ariz.

[73] Assignee: Motorola, Inc., Schaumburg, Ill.

[21] Appl. No.: 08/772,736

[22] Filed: Dec. 23, 1996

[51] Int. Cl.⁶ ........................................ G06F 7/38
[52] U.S. Cl. .................. 326/38; 326/39; 326/40; 326/41
[58] Field of Search ................. 326/38, 39, 40, 326/41

[56] References Cited

U.S. PATENT DOCUMENTS

| | | | |
|---|---|---|---|
| 5,361,224 | 11/1994 | Takasu | 365/145 |
| 5,361,225 | 11/1994 | Ozawa | 365/145 |
| 5,457,410 | 10/1995 | Ting | 326/41 |
| 5,493,239 | 2/1996 | Zlotnick | 326/38 |
| 5,606,266 | 2/1997 | Pedersen | 326/41 |
| 5,737,235 | 4/1998 | Kean et al. | 326/38 |

*Primary Examiner*—Michael Tokar
*Assistant Examiner*—Daniel D. Chang
*Attorney, Agent, or Firm*—Rennie William Dover; Robert D. Atkins

[57] ABSTRACT

A ferroelectric memory array (20) monolithically integrated with a field programmable gate array (32) into a semiconductor circuit (10). The ferroelectric memory array (20) is suitable for a semiconductor manufacturer to program the configuration data that is used in the field programmable gate array (32) prior to shipment and installation in an electronic system. The memory array (20) provides the data that configures the field programmable gate array (32) for functionality of the Configurable Logic Blocks (CLBs) in the field programmable gate array (32). Should the field programmable gate array (32) circuit lose power, the non-volatile memory array (20) provides a shift register (26) with the data to reconfigure the field programmable gate array (32).

15 Claims, 2 Drawing Sheets

CONFIGURABLE MONOLITHIC SEMICONDUCTOR CIRCUIT AND METHOD FOR CONFIGURING

BACKGROUND OF THE INVENTION

The present invention relates, in general, to integrated circuits and, more particularly, to non-volatile memories.

Field Programmable Gate Array (FPGA) integrated circuits are comprised of an array of Configurable Logic Blocks (CLBs) dynamically interconnected through programmable switches. Each of the CLBs includes logic gates, clocked latches, pass-gate transistors, and feedback structures having interconnects that are also configured through programmable switches. The programmable switches are controlled by data bits stored in the static latches of the configuration memory. Thus, the specific logic functions performed within the CLB as well as the interconnect between multiple CLBs are configured by specific data in the static latches.

A disadvantage of prior art CLBs is that the static latches lose stored data when power is removed from the integrated circuit. An external non-volatile memory, such as an Electrical Erasable Programmable Read Only Memory (EEPROM), provides the data that programs the configuration memory for reprogramming the programmable switches. Typically, FPGAs are reprogrammed during power-up. This is a relatively slow process because the external non-volatile memory provides configuration data to the internal static latches associated with the programmable switches. The external non-volatile memory requires interface pins allocated for the transfer of data from the memory to the FPGA. Serial data transfer using a single interface pin allows loading data into a shift register as a minimal pin count solution. Another disadvantage is that loading pertinent design information into a shift register from an external EEPROM is easily detected by monitoring the serial bit stream of configuration data. Thus, the configuration data and, therefore, the function performed by the FPGA is known and can be copied by a competitor.

Accordingly, it would be advantageous to have a reconfiguration method capable of rapidly programming the configuration memory and the programmable switches thereby allowing logic reprogramming during normal circuit operation. The configuration of the switches should be maintained when power is lost or removed from the integrated circuit. It would be of further advantage for the method to provide data to the programmable switches without a security risk of monitoring the configuration data.

DETAILED DESCRIPTION OF THE DRAWING

Generally, the present invention provides a monolithic circuit comprising a ferroelectric memory array integrated with a Field Programmable Gate Array (FPGA) on a semiconductor substrate. The FPGA includes Configurable Logic Blocks (CLBs) (not shown) whose inputs/outputs are connected through programmable switches to other CLBs. The programmable switches configure the CLBs to perform specific logic functions. The programmable switches are controlled by static latches to be in either an "on-state" or an "off-state". The data to configure an "on-state" or an "off-state" in the programmable switches of the FPGA is stored in the ferroelectric memory array. Thus, the logic functions performed by the monolithic circuit are configured by the data stored in the ferroelectric memory array.

It should be noted that ferroelectric devices are also described in U.S. patent application No. 08/772,735, Attorney's Docket No. CR96-131, entitled "PROGRAMMABLE SWITCH MATRIX AND METHOD OF PROGRAMMING", filed on Dec. 23, 1996, by Gardner et al., and assigned to Motorola, Inc.; U.S. patent application No. 08/772,735, Attorney's Docket No. CR96-056, entitled "FERROELECTRIC TRANSISTOR LOGIC FUNCTIONS AND METHOD FOR PROGRAMMING", filed on Dec. 23, 1996, by Ooms et al., and assigned to Motorola, Inc.; U.S. patent application No. 08/772,743, Attorney's Docket No. CR96-067, entitled "PROGRAMMABLE DISPLAY MATRIX AND METHOD OF PROGRAMMING", filed on Dec. 23, 1996, by Ooms and assigned to Motorola, Inc. The U.S. patent applications entitled "FERROELECTRIC TRANSISTOR LOGIC FUCNTIONS AND METHOD FOR PROGRAMMING" (Attorney Docket No. CR96-056), "CONFIGURABLE MONOLITHIC SEMICONDUCTOR CIRCUIT AND METHOD FOR CONFIGURING" (Attorney Docket No. CR96-132), and "PROGRAMMABLE DISPLAY MATRIX AND METHOD OF PROGRAMMING" (Attorney Docket No. CR96-067) are hereby incorporated herein by reference.

Figure 1:
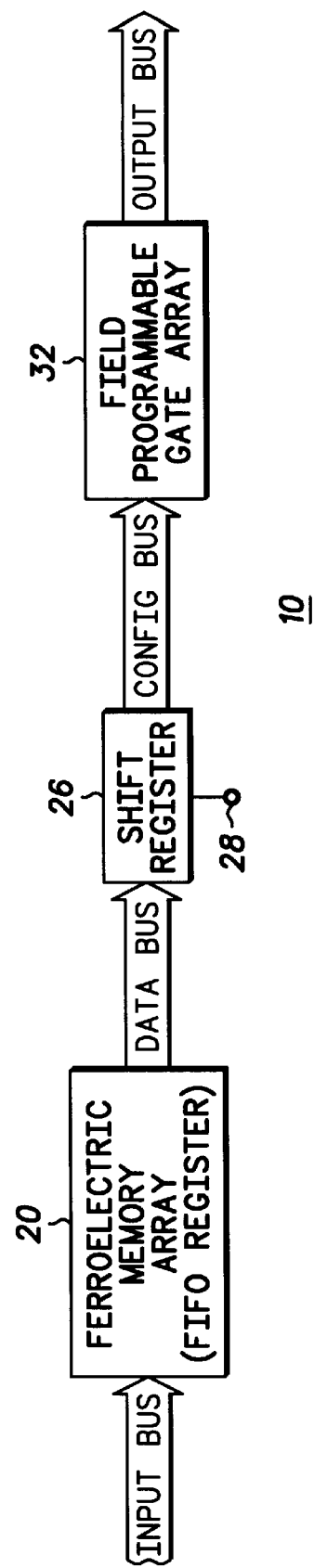
FIG. 1 is a block diagram of a configurable monolithic integrated semiconductor circuit in accordance with the present invention.

FIG. 1 is a block diagram of a configurable monolithic semiconductor circuit 10 in accordance with the present invention. A ferroelectric memory array 20 has an input that receives binary data on an INPUT BUS. The binary data is stored in memory array 20 and transferred via a DATA BUS to an input of a shift register 26. It should be noted that the binary data stored in memory array 20 is referred to as configuration data. Shift register 26 receives a clock signal CLK at clock input terminal 28. Shift register 26 has an output from which data is transferred via CONFIG BUS to an input of an FPGA 32. The output of FPGA 32 is an OUTPUT BUS which provides configurable monolithic semiconductor circuit 10 with particular programmable output data. Although the inputs and outputs of memory array 20, shift register 26, and FPGA 32 are shown and described as being buses, this is not a limitation of the present invention. It should be noted that FPGA 32 can also have ferroelectric transistors and be referred to as a ferroelectric field programmable gate array.

Ferroelectric memory array 20 uses ferroelectric transistors (not shown) for storing data. A ferroelectric transistor is programmed to be in one of two stable polarization states, i.e., an up-polarization state or a down-polarization state. A voltage causing a ferroelectric transistor to become programmed in the up-polarization state is referred to as a polarizing voltage. The voltage causing a ferroelectric transistor to become programmed in the down-polarization state is referred to as a depolarizing voltage. Voltage values between the polarizing voltage and depolarizing voltage do not cause ferroelectric transistor to change state. Thus, a ferroelectric transistor can be programmed into a polarization state and maintain that state when the programming data is removed.

In operation, the binary data received on the INPUT BUS is an M-bit data word where M is an integer number referring to the number of bits in the data word. Typically, M has a value greater than one. However, with M having a value of one, the INPUT BUS receives a 1-bit data word. In other words, INPUT BUS receives a serial data stream that is clocked into a serial-to-parallel shift register (not shown) and the data presented to memory array 20 as a data word. The width of the data word on the INPUT BUS is not intended as a limitation of the present invention.

Memory array 20 is arranged with memory cells in a matrix of rows and columns, or alternatively, as a First-In-First-Out (FIFO) array of registers. For either arrangement of memory array 20, the received M-bit data word on the INPUT BUS is stored in ferroelectric transistors located in the array that provide non-volatile storage of each M-bit data word. Polarizing voltages and depolarizing voltages are supplied to ferroelectric memory array 20 for programming the ferroelectric transistors with a polarization state based on the M-bit data word. Ferroelectric transistors maintain the polarization state should power to semiconductor circuit 10 be removed or lost.

Binary data is read from memory array 20 in accordance with the polarization states stored in the array of ferroelectric transistors. The binary data is output on the DATA BUS and transferred to shift register 26. The DATA BUS transfers N-bits of data where N is an integer number representing the width of a data word. The N-bit data word transferred on the DATA BUS is parallel loaded into N cells of shift register 26. A parallel load refers to N-bits of data being latched by shift register 26 on the transition of a clock signal CLK received at clock input terminal 28. It should be noted that the number N could have a value of one. For this example, a single data bit is transferred over the DATA BUS as a serial bit stream and the data is serially shifted into shift register 26.

Latched data from shift register 26 is output on the CONFIG BUS and transferred to the input of FPGA 32. The width of the CONFIG BUS is not intended as a limitation of the present invention. In other words the width of CONFIG bus allows the transfer of a data word that is multiple bits in width and having a length of P. The CONFIG BUS transfers a data word having a length of P-bits of data, where P is an integer. The value of P is not dependent on the values of M and N. Typically, the value of P is based on the length of shift register 26, where shift register 26 has P master/slave cells, and in turn, the length of shift register 26 is based on the number of polarization states in memory array 20. The data received from the CONFIG BUS is configuration data used in FPGA 32 to program transistor switches (not shown) in providing electrical connections for controlling the functionality of the CLBs (not shown) in FPGA 32.

The data of memory array 20 could be transferred on the INPUT BUS as provided by either the semiconductor manufacturer or end user. The non-volatile ferroelectric memory array 20 would maintain the configuration data for FPGA 32 until the semiconductor circuit is used in an electrical system. Because memory array 20 is monolithically integrated with FPGA 32, pertinent design configuration data from the internal memory is readily available.

Figure 2:
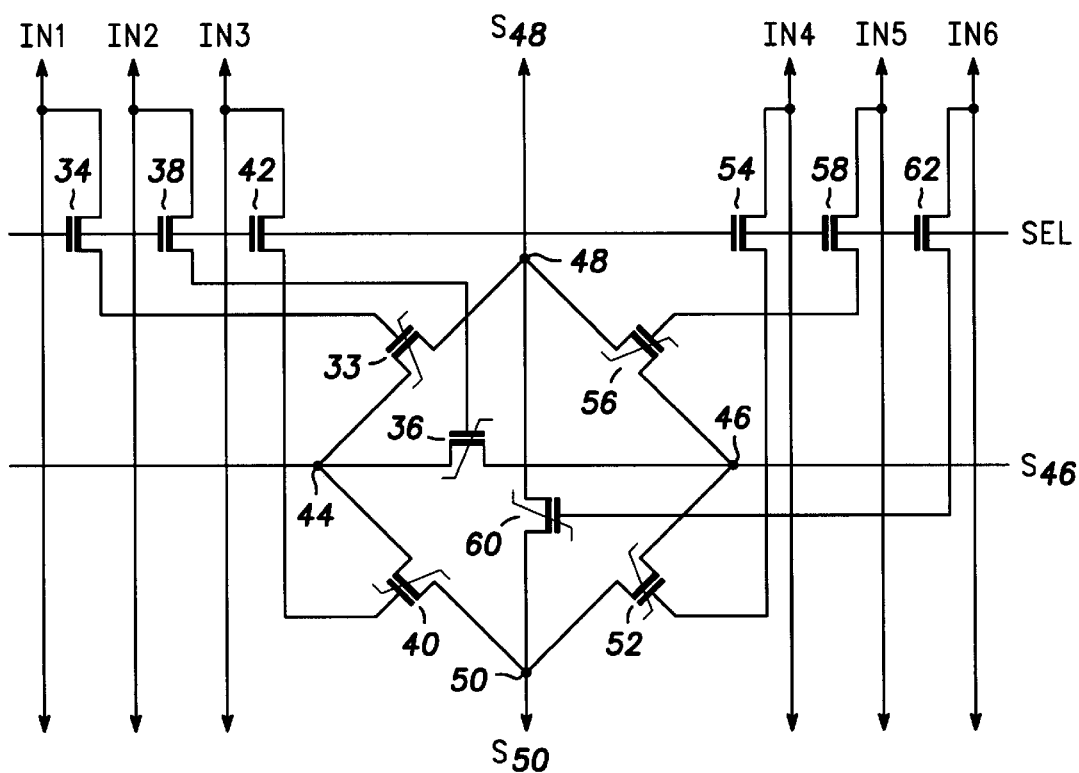
FIG. 2 is a schematic diagram that illustrates ferroelectric transistors used in the field programmable gate array of FIG. 1.

FIG. 2 is a schematic diagram of a switch netowrk 22 used in FPGA 32 in accordance with the present invention. Switch network 22 includes a plurality of programmable ferroeletric transistors 33, 36, 40, 52, 56, and 60 which cooperate with programming transistors 34, 38, 42, 54, 58, and 62 to provide a configurable electrical conduction path.

The gate terminals of programming transistors 34, 38, 42, 54, 58, and 62 are commonly connected to each other and are coupled for receiving a selection signal, SEL. The source terminals of programming transistors 34, 38, 42, 54, 58, and 62 are coupled for receiving programming signals at input terminals IN1, IN2, IN3, IN4, IN5, and IN6, respectively. The drain terminals of programming transistors 344, 38, 42, 54, 58, and 62 are connected to the gate terminals of ferroelectric transistors 33, 36, 40, 52, 56, and 60, respectively.

The source terminal of ferroelectric transistor 33 and the drain terminals of ferroelectric transistors 56 and 60 are commonly connected to form a node 48. The source terminals of ferroelectric transistors 36 and 56 and the drain terminal of ferroelectric transistor 52 are commonly connected to form a node 46. The source terminals of ferroelectric transistor 52 and 60 and the drain terminal of feroelectric transistor 40 are commonly connected to form a node 50. The source terminal of ferroelectric transistor 40 and the drain terminals of ferroelectric transistors 33 and 36 are commonly connected to for a node 44. As those skilled in the art are aware, source and drain terminals are interchangeable. Node 44, 46, 48, and 50 are connected to terminals $S_{44}$, $S_{46}$, $S_{48}$, and $S_{50}$, respectively.

In operation, switch network 22 is selected for programming when a select signal SEL is asserted. Once switch network 22 is selected, ferroelelctric transistors within switch network 22 (e.g., ferroelectric transistors 33, 36, 40, 52, 56, and 60) are programmed to be in either an up-polarization state or a down-polarization state in accordance with the voltage value of programming signals IN1, IN2, IN3, IN4, IN5, and IN6, respectively. In other words, ferroelectric transistors 33, 36, 40, 52, 56, and 60 in switch network 22 are programmed in the "on-state" are "off-state" in accordance with the polarizing or depolarizing voltages of programming signals IN1, IN2, IN3, IN4, IN5, and IN6. Thus, select signal SEL is asserted to select switch network 22 for programming and programming signals IN1, IN2, IN3, IN4, IN5, and IN6 electrically configure switch network 22. Once switch network 2 is electrically programmed, select signal SEL is set to a logic low voltage state, i.e., de-asserted, leaving switch network 22 in the electrially configured state. It should be understood that the electrically configured switch network 22 can be re-configured by re-asserting select signal SEL and re-programming the ferroelectric transistors with new programming signals IN1, IN2, IN3, IN4, IN5, and IN6.

The programming signals IN1, IN2, IN3, IN4, IN5, and IN6 have either a polarizing voltage that polarizes a ferroelectric transistor into the up-polarization state or a depolarizing voltage that polarizes a ferroelectric transistor into the down-polarization state. The ferroelectric transistors foem the switches that open or close in response to the programming. A global erasure of the switch matrix occurs when the select signal is selected and programming signals IN1, IN2, IN3, IN4, IN5, and IN6 are depolarizing voltages.

An example is presented to further illustrate programming switch network 22. By way of example, a depolarizing voltage is supplied at terminals IN1, IN2, IN4 and IN6, and a polarizing voltage is supplied at terminals IN3 and IN5. With the signal SEL at a logic one value, programmable ferroelectric transistor 33, 36, 52, and 60 are programmed in the "off-state" and programmable ferroelectric transistors 40 and 56 are programmed in the "on-state". This configuration electrically couples terminal $S_{48}$ to terminal $S_{46}$ and terminal $S_{44}$ to terminal $S_{50}$. Thus, a signal appearing at terminal $S_{48}$ appears at terminal $S_{46}$ and a signal appearing at terminal $S_{44}$ appears at terminal $S_{50}$. Accordingly, particular combinations of programming signals and select signals program the ferroelectric transistors 33, 36, 40, 52, 56, and 60 in switch network 22. The conduction state of the programmable ferroelectric transistors open and close switches that modify electrical paths connecting one Configurable Logic Block (CLB) with another CLB.

By now it should be appreciated that a non-volatile ferroelectric memory is monolithically integrated with a field programmable gate array in a semiconductor substrate to provide configuration data for programming connections in an FPGA. The data for configuring the FPGA is maintained in the non-volatile ferroelectric memory array and can be down-loaded to the shift register for reconfiguring the FPGA when power to the semiconductor circuit is removed or lost.

We claim:

1. A monolithic semiconductor circuit, comprising:

a ferroelectric memory array having an output; and a field programmable gate array that includes ferroelectric transistors having gates coupled to the output of the ferroelectric memory, the ferroelectric transistors providing data processing paths for configuring a logic function provided by the field programmable gate array.

2. The monolithic semiconductor circuit of claim 1, further comprising a shift register having an input and an output, wherein the input is coupled to the output of the ferroelectric memory array and the output is coupled to the input of the field programmable gate array.

3. The monolithic semiconductor circuit of claim 1, wherein the ferroelectric transistors of the field programmable gate array include:

a first ferroelectric transistor having a gate coupled for receiving a first programming signal;

a second ferroelectric transistor having a drain coupled to a source of the first ferroelectric transistor, and a gate coupled for receiving a second programming signal;

a third ferroelectric transistor having a drain coupled to a source of the second ferroelectric transistor, and a gate coupled for receiving a third programming signal;

a fourth ferroelectric transistor having a drain coupled to a source of the third ferroelectric transistor, a source coupled to a drain of the first ferroelectric transistor, and a gate coupled for receiving a fourth programming signal;

a fifth ferroelectric transistor having a source coupled to the source of the second ferroelectric transistor, a drain coupled to the drain of the first ferroelectric transistor, and a gate coupled for receiving a fifth programming signal; and a sixth ferroelectric transistor having a source coupled to the source of the third ferroelectric transistor, a drain coupled to the drain of the second ferroelectric transistor, and a gate coupled for receiving a sixth programming signal.

4. The monolithic semiconductor circuit of claim 1, wherein the input of the ferroelectric memory array is coupled for receiving a polarizing voltage.

5. The monolithic semiconductor circuit of claim 1, wherein the input of the ferroelectric memory array is coupled for receiving a depolarizing voltage.

6. The monolithic semiconductor circuit of claim 1, wherein the ferroelectric memory array is a First-In-First-Out (FIFO) register array.

7. A configurable monolithic semiconductor circuit, comprising:

a ferroelectric memory array for storing configuration data having an output;

a shift register having an input and an output, the input coupled to the output of the ferroelectric memory array; and a Field Programmable Gate Array (FPGA) having an input coupled to the output of the shift register, wherein the FPGA includes ferroelectric transistors having gates coupled to the output of the shift register, the ferroelectric transistors providing data processing paths for configuring a logic function provided by the field programmable gate array.

8. The configurable monolithic semiconductor circuit of claim 7, wherein the ferroelectric memory array is a First-In-First-Out (FIFO) register array.

9. A method for programming a configurable monolithic semiconductor circuit, comprising the steps of:

providing data to a ferroelectric memory array that is used to program a polarizing voltage for writing to cells in the ferroelectric memory array;

reading non-volatile stored data from the ferroelectric memory array; and configuring a field programmable gate array in accordance with the non-volatile stored data, wherein the FPGA includes ferroelectric transistors having gates coupled for receiving the non-volatile stored data, the ferroelectric transistors providing data processing paths for configuring a logic function provided by the field programmable gate array.

10. The method for programming a configurable monolithic semiconductor circuit of claim 9, further comprising the step of providing data to the ferroelectric memory array that is used to program a depolarizing voltage for writing cells in the ferroelectric memory array.

11. The method for programming a configurable monolithic semiconductor circuit of claim 9, wherein the step of providing data to a ferroelectric memory array that is used to program a polarizing voltage includes providing data to a First-In-First-Out (FIFO) register array.

12. The method for programming a configurable monolithic semiconductor circuit of claim 9, wherein the field programmable gate array is a ferroelectric field programmable gate array.

13. The method for programming a configurable monolithic semiconductor circuit of claim 9, further including the step of transferring the non-volatile stored data read from the ferroelectric memory array to the field programmable gate array.

14. The method for programming a configurable monolithic semiconductor circuit of claim 13, wherein the step of transferring the non-volatile stored data read from the ferroelectric memory array to the field programmable gate array further comprises providing a polarizing voltage to the field programmable gate array in accordance with the non-volatile stored data.

15. The method for programming a configurable monolithic semiconductor circuit of claim 13, wherein the step of transferring the non-volatile stored data read from the ferroelectric memory array to the field programmable gate array further comprises providing a depolarizing voltage to the field programmable gate array in accordance with the non-volatile stored data.

* * * * *